United States Patent [19]
Stilwell et al.

[11] Patent Number: 5,459,756
[45] Date of Patent: Oct. 17, 1995

[54] SAMPLING PHASE DETECTOR ARRANGEMENT

[75] Inventors: James H. Stilwell; Joseph H. Kao, both of Mesa, Ariz.

[73] Assignee: Motorola, Inc., Schaumburg, Ill.

[21] Appl. No.: 266,053

[22] Filed: Jun. 27, 1994

[51] Int. Cl.$^6$ ............................ H03D 3/24; H03L 7/06
[52] U.S. Cl. .................... 375/376; 327/156; 327/236; 327/244
[58] Field of Search ........................... 375/119–120; 331/1 A, 1 R, 14, 17, 25; 327/156, 161, 163, 236, 244, 246; 326/93

[56] References Cited

U.S. PATENT DOCUMENTS 4,987,373  1/1991  Soo ............................ 328/155
5,319,680  6/1994  Port et al. ..................... 375/119

*Primary Examiner*—Young Tse
*Attorney, Agent, or Firm*—Frank J. Bogacz

[57] ABSTRACT

A sampling phase detector for a data bit synchronizer produces a constant level in the absence of data bit transitions. Reference voltages are provided and a switch selects between these reference voltages to provide an output which changes only when a data bit is detected and otherwise remains at a constant level. A loop filter operates together with the sampling phase detector to provide the constant voltage output in the absence of data bit transitions.

16 Claims, 3 Drawing Sheets

5,459,756

SAMPLING PHASE DETECTOR ARRANGEMENT

GOVERNMENT LICENSE RIGHTS

The U.S. Government has a paid-up license in this invention and the right in limited circumstances to require the patent owner to license others on reasonable terms as provided for by the terms of contract no. DAAB07-92-C-L0001 awarded by the U.S. Army.

BACKGROUND OF THE INVENTION

The present invention pertains to bit synchronization and more particularly to a sampling phase detector.

A bit synchronizer is generally referred to as the mechanism used to reconstruct data from a noisy data stream and generate a data clock which is in phase with the noisy data stream. The data can be noise free such as from a hard-wired computer network or noisy, due to a low level RF channel.

In the case of noisy data, the data is filtered with a data filter to optimize the Signal to Noise ratio (S/N). In order to generate a reference clock, clock components are generated from the data signal and used for a phase lock loop or high Q filter input.

One method for generating the clock components from the filtered data is to take the absolute value of the derivative of the data. This operation generates a pulse every time there is a data transition. These pulses create spectral clock components at the data rate. The spectral component amplitude is directly proportional to the data transition density.

In order to generate a continuous clock, typically a phase lock loop is used to act as a narrow band filter around the spectral clock component. For a conventional phase lock loop, the phase detector gain is proportional to the data transition density. Since the phase lock loop gain is proportional to the phase detector gain, the loop gain is proportional the data transition density.

In many cases the use of a conventional phase detector is not acceptable because of the dependence of loop bandwidth on the data transition density.

What is needed is a phase detector which improves tracking performance of data bit streams for a wide range of data transition densities and utilizes simple circuitry for its implementation.

DESCRIPTION OF THE PREFERRED EMBODIMENT

Figure 1:
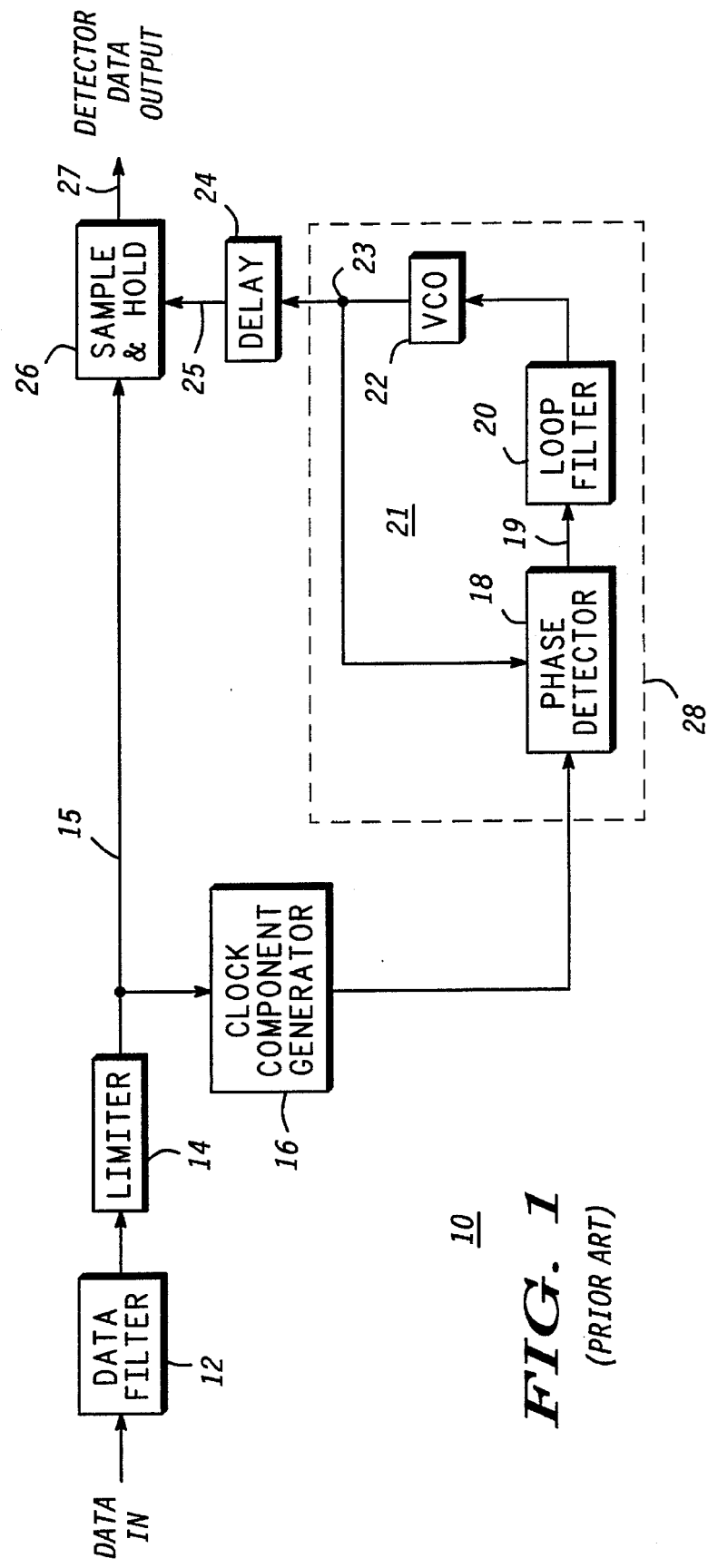
FIG. 1 is a block diagram of a prior art bit synchronizer.

A bit synchronizer generates a data clock and reconstructs the digital data from a noisy input data stream. FIG. 1 illustrates a block diagram of a prior art conventional bit synchronizer system 10. The noisy data is filtered by a data filter 12, the characteristics of which optimizes the input data Signal to Noise ratio (S/N). The resulting filtered data is often hard limited with a limiter 14 to facilitate analog and digital circuit integration. A data clock is generated from the limited data on lead 15 by means of a clock component generator 16 and a phase lock loop 28. The resulting phase lock loop output clock on lead 23 has a fixed phase relationship to the limited data on lead 15.

The clock is delayed by delay 24 and used to sample the limited data on lead 15 by a sample and hold circuit 26. The resulting sampled data on lead 27 represents the detected data output. This basic way of generating data clock components and creating a data clock by a phase lock loop is well understood by those familiar in the art.

A method for generating the clock components, clock component generator 16, from the hard limited data is to take the absolute value of the derivative of the data on lead 15. The absolute value operation generates positive pulses of clock components at the data rate. A "delay and multiply" circuit is another practical method used to implement the clock component generation circuitry 16. Data transitions created from the clock component generator 16 develops the clock component for the phase lock loop 28 input.

The phase lock loop 28 is made up of three key components: phase detector 18, loop filter 20, and voltage controlled oscillator (VCO) 22. The art of using a phase lock loop 28 is common practice in bit synchronizer implementations. The phase lock loop 28 acts as a narrow band bandpass filter on the input clock from the clock component generator output. This narrow filter can be thought of as a "flywheel" which generates a constant clock at the data rate when sporadic clock components are injected into the filter.

The phase detector 18 is often configured as a multiplier. The phase detector 18 multiplies the VCO 22 and clock component generator 16 output. The resulting multiplication output on lead 19 is a DC voltage which represents the phase relationship between the two phase detector inputs. This phase detector output on lead 19 is filtered with a loop filter 20 generating the VCO control voltage, which controls the VCO frequency and more specifically the VCO phase relative to the limited data on lead 15.

In the case of a first order loop, the loop filter 20 is nothing more than an amplifier which sets the phase lock loop gain. In the case of a higher order phase lock loop, the loop filter 20 includes the circuit network necessary to generate the desired amplitude and phase characteristics. The design techniques for a conventional phase lock loop are well understood by those familiar in the art.

The data clock on lead 23 generated by the VCO 22 of phase lock loop 28 is correctly phased with the limited data on lead 15 by means of a delay circuit 24. The limited data on lead 15 is sampled by a sample and hold circuit 26 with the delayed clock on lead 25. The detected data on lead 27 out of the sample and hold 26 represents the reconstructed data stream.

On the average, the data transition density for random data is 50%. In other words, the data changes polarity half the time. This is nothing more than a "coin-flip" where on the average half the flips are heads and half the flips are tails. For a continuous phase detector such as a multiplier, the energy developed at the phase detector output is directly proportional to the data transition density. In the absence of data transitions, there is no way of knowing the location of the data edges. Since a phase lock loop gain is directly proportional the phase detector gain and a continuous phase detector gain is directly proportional to the data transition density, the loop gain varies as the data transition density varies. Over short periods of time the phase lock loop gain can vary greatly. Since the loop bandwidth is directly related to loop gain, varying transition density will cause the loop characteristics to vary widely. A sampling phase detector may be used to reduce the sensitivity of loop bandwidth on transition density. Unlike a continuous phase detector which is continuously active, a sampling phase detector is active only during a data transition. Thus the loop gain is held constant over varying data transition densities (data patterns) which occurs in random data.

Figure 2:
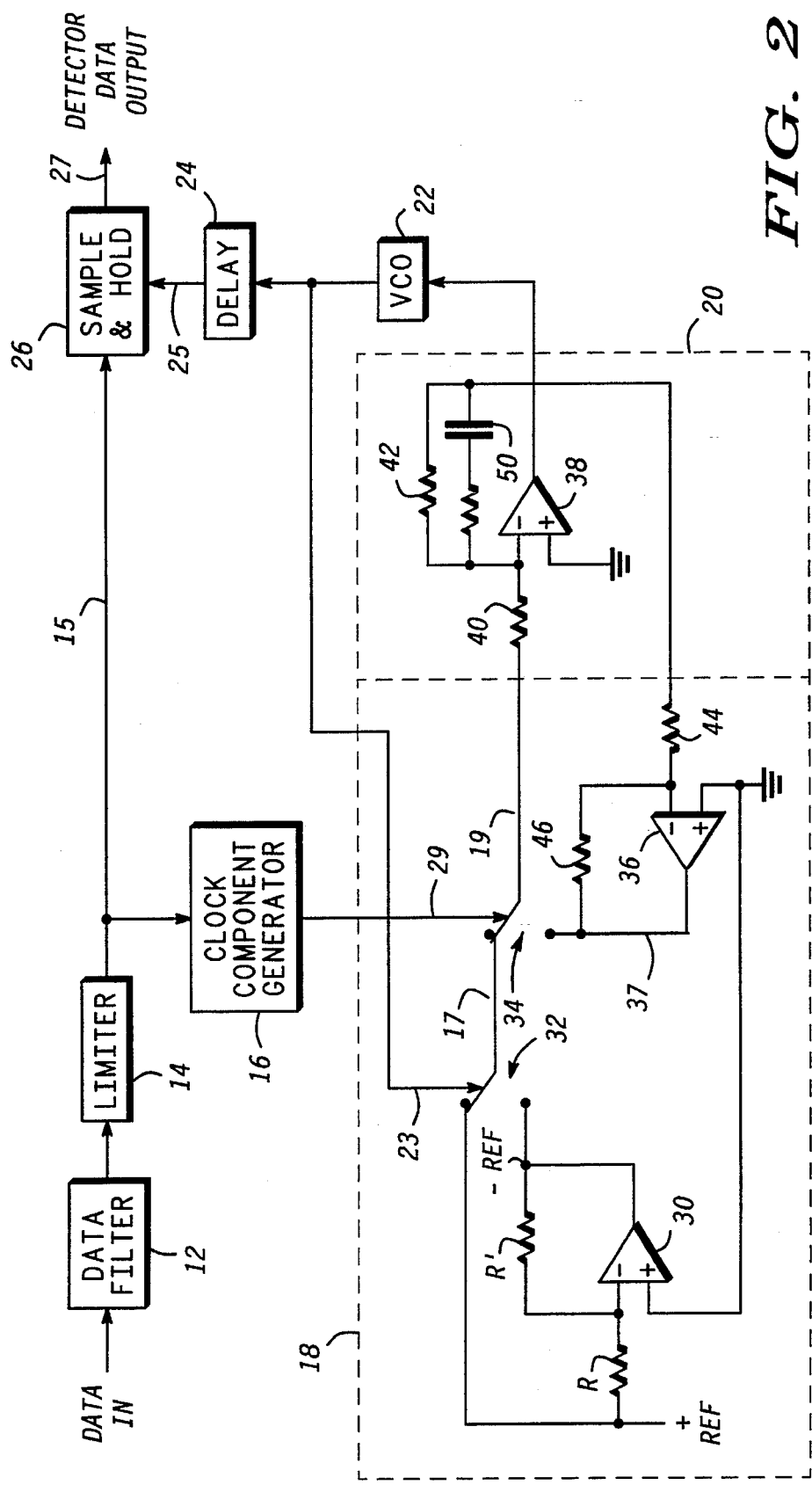
FIG. 2 is a schematic diagram of a sampling phase detector in accordance with the present invention.

FIG. 2 shows a unique sampling phase detector 18 and loop filter 20 implementation which can be configured with low cost circuits for low and moderate data rate bit synchronizers applications. All bit synchronizer components shown in FIG. 2 other than the phase detector 18 and interconnection to the loop filter 20 have been previously described and shown in FIG. 1.

An accurate symmetrical VCO output reference on lead 17 is generated by operational amplifier 30. Operational amplifier 30 generates an accurate inverted replica −ref of the +ref voltage. This is accomplished by configuring operational amplifier 30 in an inverted unity gain configuration.

Switches 32 and 34 are electronic analog switches. This implementation utilizes a precision CMOS single pole double throw switch part no. DG419 in its preferred embodiment.

Amplitude symmetry is generated by using the VCO output on lead 23 to switch between the +ref and −ref at the control input of switch 32. The balance between +ref and −ref is dominantly defined by the balance of the input and feedback resistors, R and R' respectively. The +ref or −ref signal output on lead 17 is used as the sample and hold input signal on lead 17 into switch 34. See FIG. 3 for a depiction of the +ref and −ref signals on lead 17 responsive to the input data on lead 15. The clock component generator output on lead 29 controls switch 34 which switches between the VCO controlled +ref and −ref signal on lead 17 and a hold signal on lead 37 from the loop filter's operational amplifier 36 on lead 37.

In the absence of data transitions, the loop filter capacitor 50 voltage is held constant by the control loop made up of operational amplifiers 38 and 36 and switch 34. This is accomplished by setting the gain of operational amplifier 36 equal to the inverse of operational amplifier 38 gain so that no current will charge or discharge the loop filter capacitor 50. During this period of no data transition, the switch 34 output on lead 19 is the output of amplifier 36 on lead 37.

Low input offset operational amplifiers are desirable for operational amplifiers 30, 36 and 38. This implementation utilizes dual FET operational amplifiers in an eight pin surface mount package part no. LT1013 in its preferred embodiment. A typical value of capacitor 50 for this implementation may be 0.1 micro Farads, for example.

In order to hold the voltage across capacitor 50 constant in the absence of a data transition, resistor 46 is set to the value of resistor 40 and resistor 44 is set to the value of resistor 42. Thus during the absence of a data transition, the voltage across the capacitor 50 of loop filter 28 is primarily affected by:

1) Balance of resistors 40, 42, 44 and 46.

2) Leakage current of loop filter capacitor 50

3) Input bias current of operational amplifiers 36 and 38.

It should be noted that switch 34 output voltage on lead 19 and the current through resistor 40 is typically not zero because frequency offsets generally exist either from the input source limited data on lead 15 or an error in the VCO 22 center frequency. Furthermore, if the loop filter 20 is configured as a perfect second order loop, operational amplifier 36 would not be needed and the associated switch 34 input would be grounded.

Figure 3:
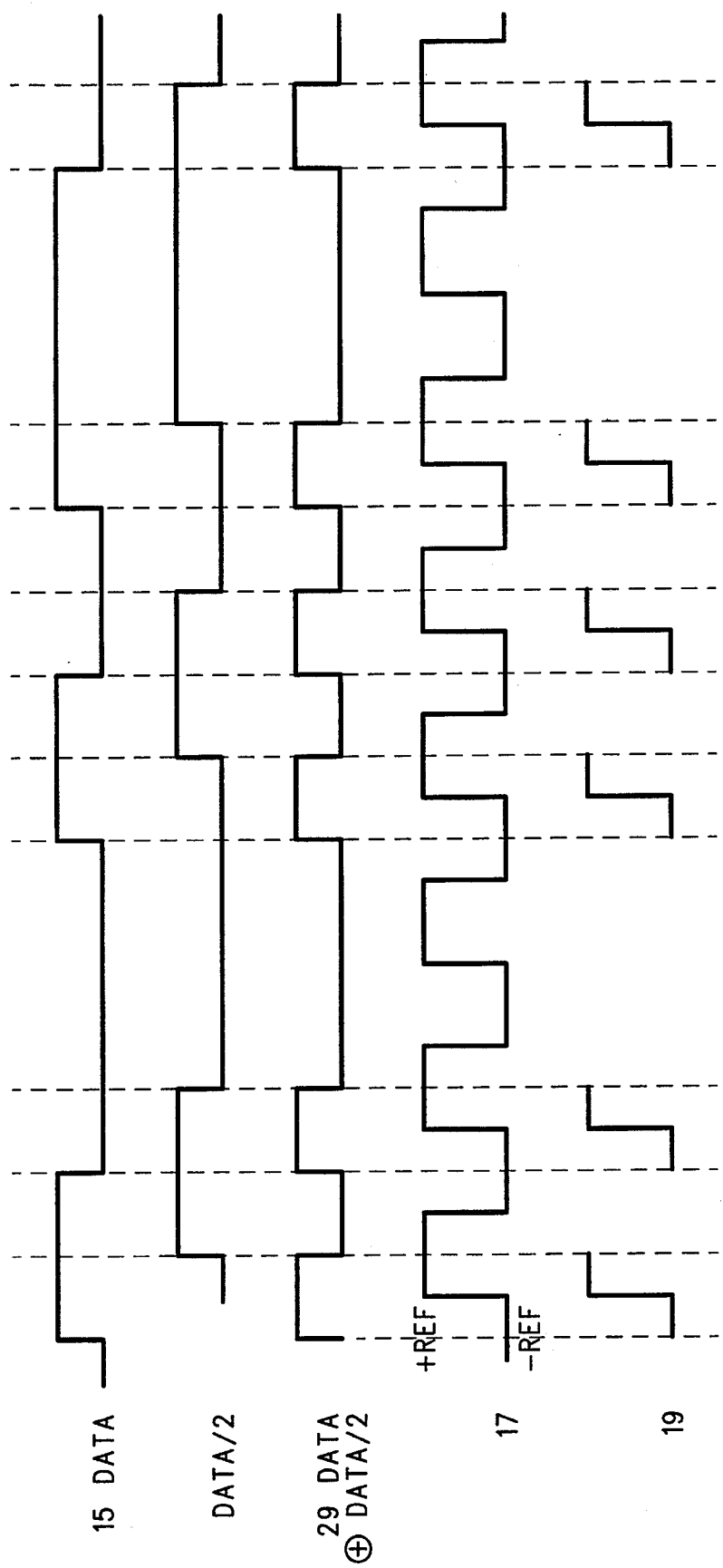
FIG. 3 is a timing diagram of various wave forms of the sampling phase detector in accordance with the present invention.

Referring to FIG. 3, wave forms of various leads of FIG. 2 are shown. Wave form on lead 15 is the limited data which is the input data after the operation of limiter 14. The second wave form from the top is a wave form generated internally by clock component generator 16. This wave form is a delayed version of the wave form of lead 15. This wave form is delayed by one-half a bit time. Although a delay of one-half a bit time is shown, the delay may be just a sight delay, much less than one-half a bit time. The next wave form is an exclusive-OR of the previous two wave forms. This signal is output on lead 29 by clock component generator 16.

The next wave form is the +ref and −ref signals on lead 17 through switch 32. The last wave form is the output on lead 19 through switch 34 of sampling phase detector 18.

This sampling phase detector can be used for a bit synchronizer where data transition density enters into the loop performance. Unlike a conventional phase detector which is continuously active, a sampling phase detector is active only during a data transition. Thus the loop gain is held constant over varying data transition densities which occur in random data patterns.

Sampling phase detectors have significant performance advantages over continuous conventional phase detectors. The reason that sampling phase detectors have not been generally implemented is that the perceived hardware complexity has typically been more complicated than conventional phase detectors.

The present sampling phase detector offers the following advantages over conventional phase detectors. This sampling phase detector improves the tracking performance for a data bit synchronizer loop which idles for missing data transitions. This sampling phase detector maintains the same frequency acquisition range as a conventional phase detector over varying data transitions densities. The present implementation of a sampling phase detector utilizes low cost analog operational amplifiers and switches, minimizes any induced phase offset by the circuit and provides excellent sample and hold performance.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A sampling phase detector arrangement for a data bit synchronizer including a clock generator and a voltage controlled oscillator, said sampling phase detector arrangement comprising:

a sampling phase detector for producing an output signal in response to data bit transitions of the clock generator, said sampling phase detector coupled to said voltage controlled oscillator and to said clock generator;

a loop filter for generating a control voltage from said output signal, said control voltage for operating said voltage controlled oscillator at a constant voltage level in an absence of said data bit transitions, said loop filter coupled to said sampling phase detector and to said voltage controlled oscillator;

said sampling phase detector including:
a source of a first reference voltage; and
means for inverting said first reference voltage to produce a second reference voltage, said means for inverting coupled to said source of said first reference voltage;
said means for inverting including:
a first operational amplifier for producing said second reference voltage, being an inverted unity gain voltage version of said first reference voltage, from said first reference voltage;
a first resistor coupled between said source of said first reference voltage and a first input of said first operational amplifier; and
a second resistor coupled in a feedback configuration between said first input of said first operational amplifier and an output of said first operational amplifier to produce said inverted unity gain voltage.

2. A sampling phase detector arrangement as claimed in claim 1, wherein said sampling phase detector further includes a first switch for producing an output of said first reference voltage and alternatively producing an output of said inverted unity gain voltage in response to a selection by said voltage controlled oscillator, said first switch coupled to said first operational amplifier, to said source of said first reference voltage and to said voltage controlled oscillator.

3. A sampling phase detector arrangement as claimed in claim 2, wherein said sampling phase detector further includes a second switch for selecting either said source of said first reference voltage or said output of said first operational amplifier and alternatively selecting a hold signal of a second operational amplifier, said second switch coupled to said first switch, to said clock generator and to said loop filter.

4. A sampling phase detector arrangement as claimed in claim 3, wherein said sampling phase detector further includes said second operational amplifier for producing said hold signal, said second operational amplifier coupled to said second switch and to said loop filter.

5. A sampling phase detector arrangement as claimed in claim 4, wherein said sampling phase detector further includes:
a third resistor coupled between said loop filter and said second operational amplifier; and
a fourth resistor coupled to an output of said second operational amplifier and coupled to a connection of said third resistor and an input of said second operational amplifier, said fourth resistor for producing said hold signal.

6. A sampling phase detector arrangement as claimed in claim 5, wherein said loop filter includes a fifth resistor coupled to said second switch, said fifth resistor being approximately equal in value to said fourth resistor.

7. A sampling phase detector arrangement as claimed in claim 6, wherein said loop filter further includes a third operational amplifier for producing said control voltage to operate said voltage controlled oscillator, said third operational amplifier coupled to said fifth resistor and to said third resistor.

8. A sampling phase detector arrangement as claimed in claim 7, wherein said loop filter further includes:
a sixth resistor coupled in a feedback arrangement between an output of said third operational amplifier and a first input of said third operational amplifier, said sixth resistor being approximately equal in value to said third resistor; and
a capacitor coupled in parallel with said sixth resistor, said capacitor for maintaining said output of said third operational amplifier at a constant voltage in said absence of said data bit transitions.

9. A data bit synchronizer comprising:

a filter for filtering input data;
a limiter coupled to the filter;
a clock generator coupled to the limiter for producing periodic pulses at a predetermined frequency;
a sampling phase detector for producing an output signal in response to data bit transitions of the clock generator, said sampling phase detector coupled to said clock generator;
a loop filter for generating a control voltage from said output signal to produce a constant voltage level in an absence of said data bit transitions, said loop filter coupled to said sampling phase detector;
a voltage controlled oscillator for producing a phase lock signal in response to said constant voltage level of said loop filter, said voltage controlled oscillator coupled to said loop filter and to said sampling phase detector;
a delay for delaying said phase lock signal, said delay coupled to said voltage controlled oscillator;
a sample and hold circuit coupled to said limiter and to said delay, said sample and hold circuit for producing a detected data output signal.
said sampling phase detector including:
a source of a first reference voltage: and
means for inverting said first reference voltage to produce a second reference voltage, said means for inverting coupled to said source of said first reference voltage;
said means for inverting including:
a first operational amplifier for producing said second reference voltage, being an inverted unity gain voltage version of said first reference voltage, from said first reference voltage;
a first resistor coupled between said source of said first reference voltage and a first input of said first operational amplifier; and
a second resistor coupled in a feedback configuration between said first input of said first operational amplifier and an output of said first operational amplifier to produce said inverted unity gain voltage.

10. A data bit synchronizer as claimed in claim 9, wherein said sampling phase detector further includes a first switch for producing an output of said first reference voltage and alternatively producing an output of said inverted unity gain voltage in response to a selection by said voltage controlled oscillator, said first switch coupled to said first operational amplifier, to said source of said first reference voltage and to said voltage controlled oscillator.

11. A data bit synchronizer as claimed in claim 10, wherein said sampling phase detector further includes a second switch for selecting either said source of said first reference voltage or said output of said first operational amplifier and alternatively selecting a hold signal of a second operational amplifier, said second switch coupled to said first switch, to said clock generator and to said loop filter.

12. A data bit synchronizer as claimed in claim 11, wherein said sampling phase detector further includes said second operational amplifier for producing said hold signal, said second operational amplifier coupled to said second switch and to said loop filter.

13. A data bit synchronizer as claimed in claim 12, wherein said sampling phase detector further includes:
a third resistor coupled between said loop filter and said second operational amplifier; and
a fourth resistor coupled to an output of said second operational amplifier and coupled to a connection of said third resistor and an input of said second operational amplifier, said fourth resistor for producing said hold signal.

14. A data bit synchronizer as claimed in claim 13, wherein said loop filter includes a fifth resistor coupled to said second switch, said fifth resistor being approximately equal in value to said fourth resistor.

15. A data bit synchronizer as claimed in claim 14, wherein said loop filter further includes a third operational amplifier for producing said control voltage to operate said voltage controlled oscillator, said third operational amplifier coupled to said fifth resistor and to said third resistor.

16. A data bit synchronizer as claimed in claim 15, wherein said loop filter further includes:

a sixth resistor coupled in a feedback arrangement between an output of said third operational amplifier and a first input of said third operational amplifier, said sixth resistor being approximately equal in value to said third resistor; and a capacitor coupled in parallel with said sixth resistor, said capacitor for maintaining said output of said third operational amplifier at a constant voltage in said absence of said data bit transitions.

\* \* \* \* \*